(12) United States Patent
Berger

(10) Patent No.: US 6,631,151 B1
(45) Date of Patent: Oct. 7, 2003

(54) PARAMETRICAL GENERATION LASER

(75) Inventor: Vincent Berger, Montrouge (FR)

(73) Assignee: Thomson-CSF, Paris (FR)

( * ) Notice: Subject to any disclaimer, the term of this patent is extended or adjusted under 35 U.S.C. 154(b) by 0 days.

(21) Appl. No.: 09/672,314

(22) Filed: Sep. 29, 2000

(30) Foreign Application Priority Data

Oct. 1, 1999 (FR) .......................................... 99 12303

(51) Int. Cl.⁷ ................................................ H01S 5/00
(52) U.S. Cl. ...................................................... 372/45
(58) Field of Search ............................. 372/45, 43, 46, 372/50

(56) References Cited

U.S. PATENT DOCUMENTS

| | | |
|---|---|---|
| 5,448,584 A | 9/1995 | Ueno |
| 5,684,817 A | 11/1997 | Houdre et al. ................. 372/45 |
| 5,739,949 A | 4/1998 | Rosencher et al. .......... 359/332 |
| 5,969,375 A | 10/1999 | Rosencher et al. ............ 357/21 |
| 6,091,751 A | 7/2000 | Berger .......................... 372/43 |
| 6,252,895 B1 * | 6/2001 | Nitta et al. .................... 372/45 |

OTHER PUBLICATIONS

Nagaatsu Ogasawara, et al., "Second Harmonic Generation in an AlGaAs Double–Heterostructure Laser", Japanese Journal of Applied Physics, vol. 26, No. 8, Aug. 1987, pp. 1386–1387.

Takao Furuse, et al., "Internal Second Harmonic Generation In GaAsP DH Lasers", Optics Communications, vol. 35, No. 3, Dec. 1, 1980, pp. 413–416.

R.G. Ispasoiu, et al., "Measurement of Enhanced Radiant Power of Internal Second Harmonic Generation in InGaAs/GaAs/AlGaAs Strained SQW BH LDs, by an Indirect Method", International Journal of Optoelectronics, vol. 11, No. 2, Mar. 1, 1997, pp. 127–131.

G. Leo, et al., "Parametric Fluorescence in Oxidized AlGaAs Waveguides", Journal of the Optical Society of America B, vol. 16, No. 9, Sep. 1, 1999, pp. 1597–1602.

G. Leo, et al., "Parametric Processes in GaAs/Alox Structures", Nonlinear Materials, Devices, and Applications; Proceedings of SPIE—The International Society for Optical Engineering, vol. 3928, Jan. 24 and 25, 2000, pp. 94–107.

* cited by examiner

Primary Examiner—Paul Ip
Assistant Examiner—Jeffrey Zahn

(57) ABSTRACT

This semiconductor laser comprises at least two layers of optically non-linear material as well as a quantum well at least located within one of the layers of optically non-linear material. The thicknesses and optical indices of these two layers are such that the waveguide constituted by these two layers has a modal phase matching condition for the process of parametrical fluorescence between the pump wave emitted by the quantum well and the parametrical conversion waves.

7 Claims, 6 Drawing Sheets

REFRACTION INDEX
AS A FUNCTION OF
THICKNESS

PARAMETRICAL GENERATION LASER

BACKGROUND OF THE INVENTION

1. Field of the Invention

The invention relates to a parametrical generation laser and more particularly to a semiconductor laser used for parametrical generation from a pump wave $\omega_1$.

Parametrical fluorescence is indeed well known in non-linear optics. This phenomenon is the generation, within what is called a non-linear material and from a beam known as a pump beam (at the frequency referenced $\omega_1$), of two beams (known as the signal and idler beam at the frequencies $\omega_1$ and $\omega_3$). The principle of the conservation of energy implies $\omega_2+\omega_3=\omega_1$. By placing the non-linear material in a cavity in which one or two generated frequencies resonate, it is possible to obtain an optical parametrical oscillator (OPO). OPOs are very widespread, and are used as light-tuneable coherent sources at frequencies that are poorly covered by lasers (the mean infrared or visible range for example). The problem with OPOs is their high space requirement and complexity since the full system comprises a pump laser, a non-linear crystal and cavity mirrors.

2. Description of the Prior Art

The difficulty of obtaining parametrical generation is related to the need for what is known by those skilled in the art as phase matching. Owing to the dispersion of the optical index with the wavelength, the different interacting waves ($\omega_1$; $\omega_2$ and $\omega_3$) do not move at the same speed in the material. The result of this is that non-linear interaction becomes highly destructive and the process loses its efficiency. To obtain efficient parametrical generation, it is therefore necessary to obtain phase matching which maintains a constructive interaction throughout the propagation. This phase matching, which can also be interpreted as a conservation of moment, can be written as the relationship between the optical indices $n_1$ at the frequencies $\omega_1$:

$$n_2\omega_2+n_3\omega_3=n_1\omega_1. \quad (1)$$

In OPOs made until now, different techniques are used to meet this indispensable relationship: for example phase matching using birefringent materials or again quasi-phase matching are the two most commonly used techniques. Another method is a modal phase matching. It consists in using the dispersion relationship of the different modes existing inside a waveguide to finally verify the relationship (1). This is impossible if we consider only the fundamental mode of the waveguide. It is therefore necessary to use different order modes for the different waves. This method of modal phase matching is the one used in the framework of the invention. The invention uses for example the fundamental mode for the signal and idler waves but the second-order mode for the pump wave. For this method, it is shown that the efficiency of the parametrical generation is proportional to the following integral:

$$\iint dxdy\chi^{(2)}(x,y)E_{\omega_1}^{2*}E_{\omega_2}^{1}E_{\omega_3}^{1}(x,y) \quad (2)$$

The integral is obtained in the plane perpendicular to the waveguide (section plane) and $E_{\omega_i}^{1}$ designates the field at the frequency $\omega_j$ for the i order mode. This is a major difficulty for preventing the non-nullity of this integral once we take account of different order modes. Indeed, the relationship of orthogonality between the different order modes cancels the integral in principle:

$$\iint dxdy E_{\omega_1}^{2}E_{\omega_1}^{1} \quad (3)$$

Since the fundamental modes $E_{\omega_1}^{1}$ and $E_{\omega_2}^{1}$ at the frequencies $\omega_1$ and $\omega_2$ are, in a usual waveguide, quasi-identical, the integral (2) is always small. This has hitherto limited the use of this modal phase matching method According to the invention, the device is designed precisely so that the waveguide has a big integral (2). The conclusion here is that, for the parametrical generation in a waveguide to be efficient, the relationship (1) (phase matching) should be verified and the overlapping integral (2) should be optimized.

SUMMARY OF THE INVENTION

The invention therefore relates to a laser structure in which the laser wave may be used as a pump source for parametrical generation, this laser structure being designed to verify these two conditions.

The invention thereof relates to a semiconductor laser comprising at least two layers of optically non-linear material as well as a quantum well at least located within one of the layers of optically non-linear material, the thicknesses and optical indices of these two layers being such that the waveguide constituted by these two layers has a modal phase matching condition for the process of parametrical fluorescence between the pump wave emitted by the quantum well and the parametrical conversion waves.

BRIEF DESCRIPTION OF THE DRAWINGS

The different objects and features of the invention shall appear more clearly from the following description given by way of an example as well as from the appended figures, of which.

MORE DETAILED DESCRIPTION

The invention is therefore a semiconductor laser structure in which the deposited semiconductor layers have been chosen so that:

1) the relationships of dispersion of the modes are propagated in the waveguide of the laser verifying the modal phase matching relationship for a parametrical generation process;
2) the overlapping integral (2) is optimized.

Figure 1A:
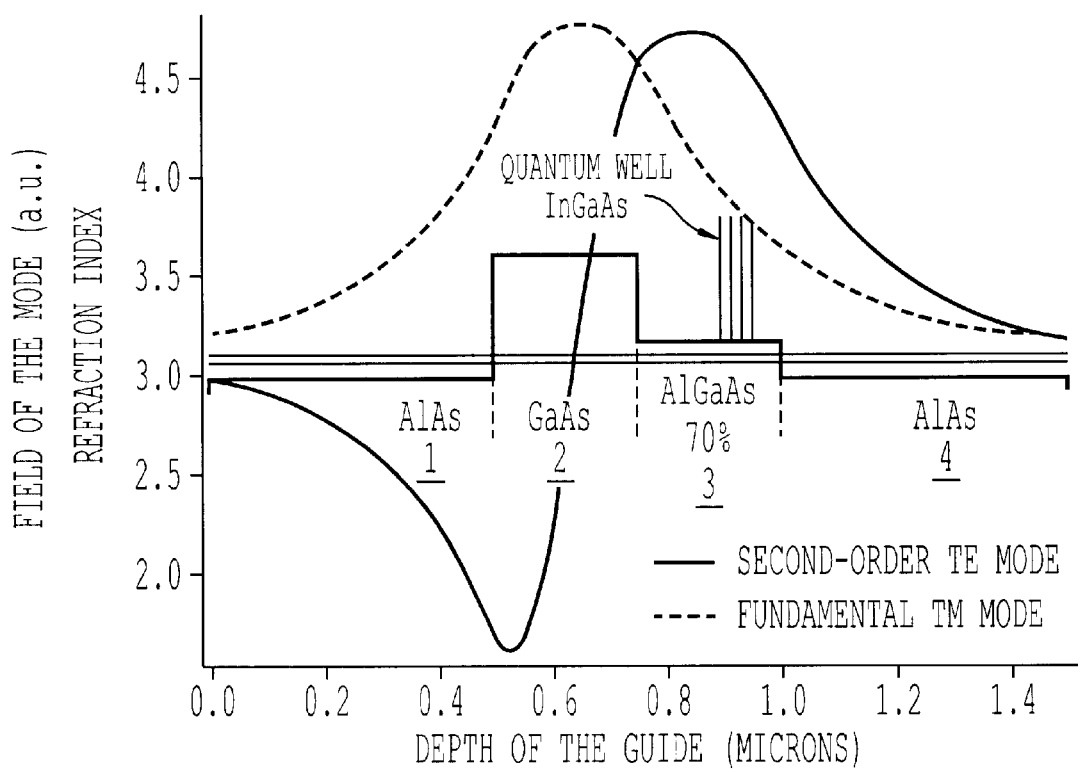
FIGS. 1a and 1b show an exemplary embodiment of a laser according to the invention.
Figure 1B:
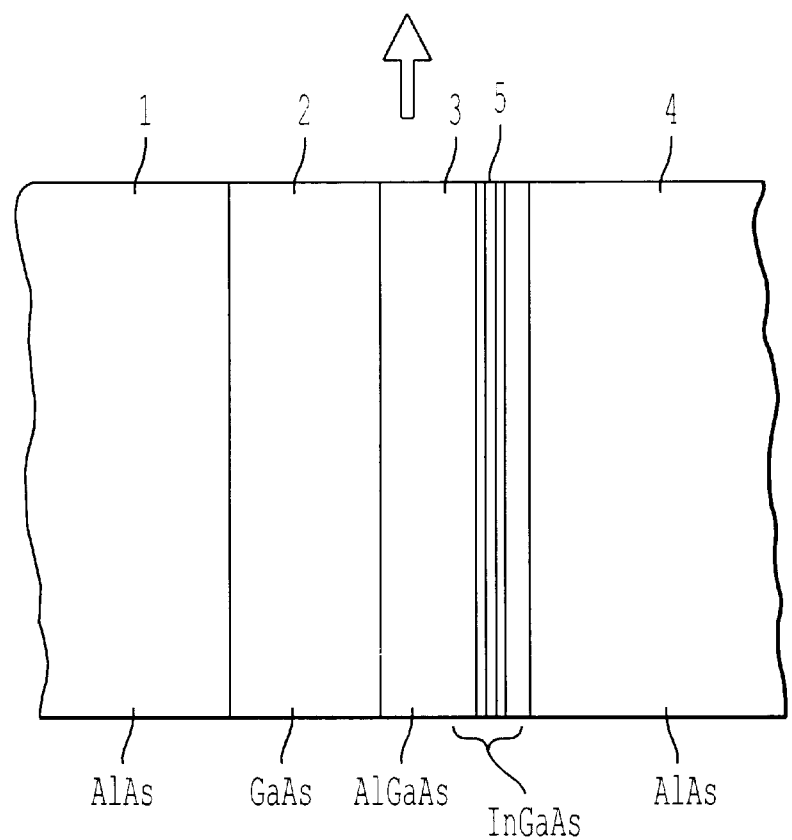

FIGS. 1a and 1b show an exemplary embodiment of a laser according to the invention.

This laser comprises chiefly a stack of semiconductor materials comprising at least two layers 2, 3 made of non-linear materials, and a stack of quantum wells 5 . The two layers 2, 3 are gripped between two confinement layers 1 and 4. This stack of quantum wells 5 is located in the layer of non-linear material with a lower index. In general, if there were two layers of non-linear materials, the quantum well would preferably not be in the layer with the higher index.

The thicknesses and the indices of the layers 2 and 3 made of non-linear material are such that the second-order mode at the wavelength $\omega_1$ and the fundamental modes of the wavelengths $\omega_2$ and $\omega_3$ meet the above relationships (1) and (2).

The thicknesses of the layers of non-linear materials are therefore chosen as a function of their indices so that there is modal phase matching for the parametrical fluorescence process between the pump wave sent by the quantum well and the waves coming from the parametrical conversion.

It must be noted also that the pump mode ($\omega_1$) should not be located on the fundamental mode of the waveguide.

The materials indicated in FIGS. 1a and 1b are given only by way of non-restrictive examples.

A semiconductor laser made according to the invention will therefore essentially send three frequencies simultaneously: the so-called laser frequency herein referenced $\omega_1$, which results from the stimulated emission in the quantum wells in a manner totally similar to the emission of a standard quantum well laser; and the frequencies $\omega_2$ and $\omega_3$ which are the signal wave and the idler wave that result from the parametrical generation of the laser wave $\omega_1$, used as a pump wave for this non-linear process. At low operating power, the spectrum of parametrical fluorescence is wide (a continuum) and at high power the device works like an optical parametrical oscillator and its spectrum consists of two highly precise frequencies $\omega_2$ and $\omega_3$. It is possible that the device may be used in a simple way for its parametrical fluorescence, below the optical parametrical oscillation threshold. This is a source of twin photons that can be used for example in quantum cryptography (see FIG. 2b).

Figure 2A:
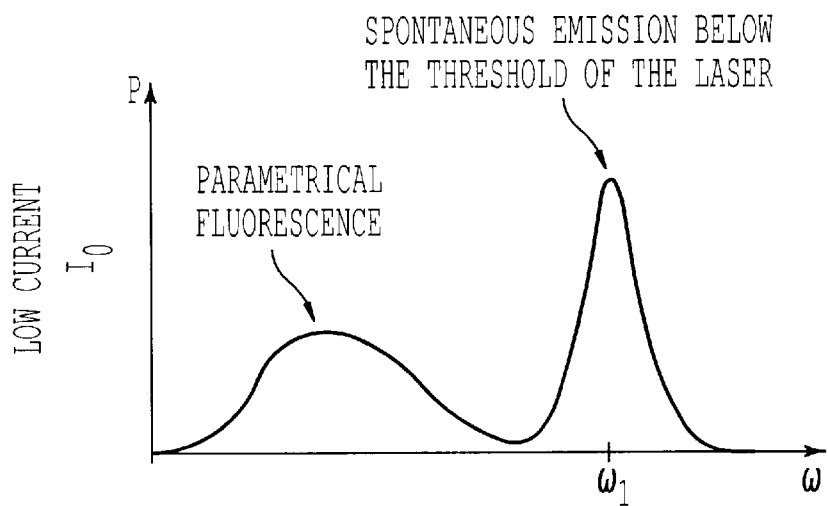
FIGS. 2a to 2c show examples of the working of a laser showing the value of the invention.
Figure 2B:
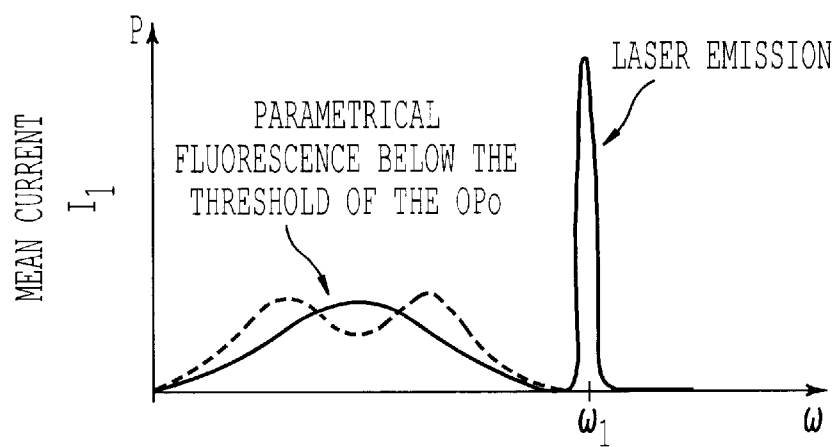
Figure 2C:
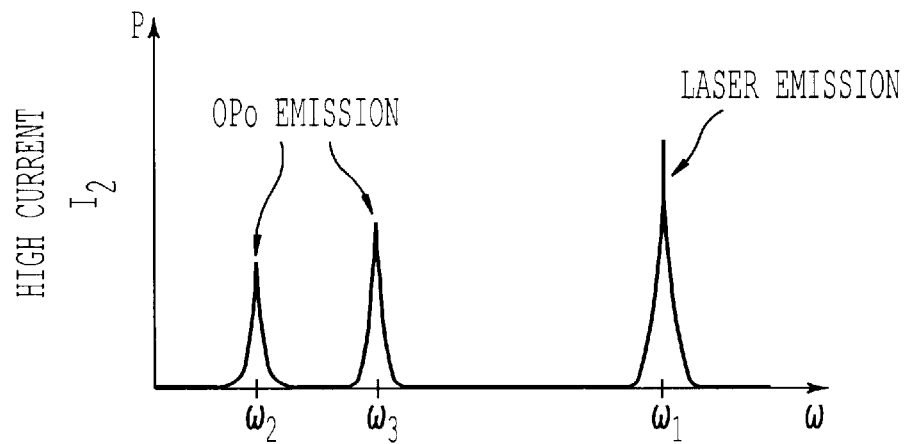
Figure 3:
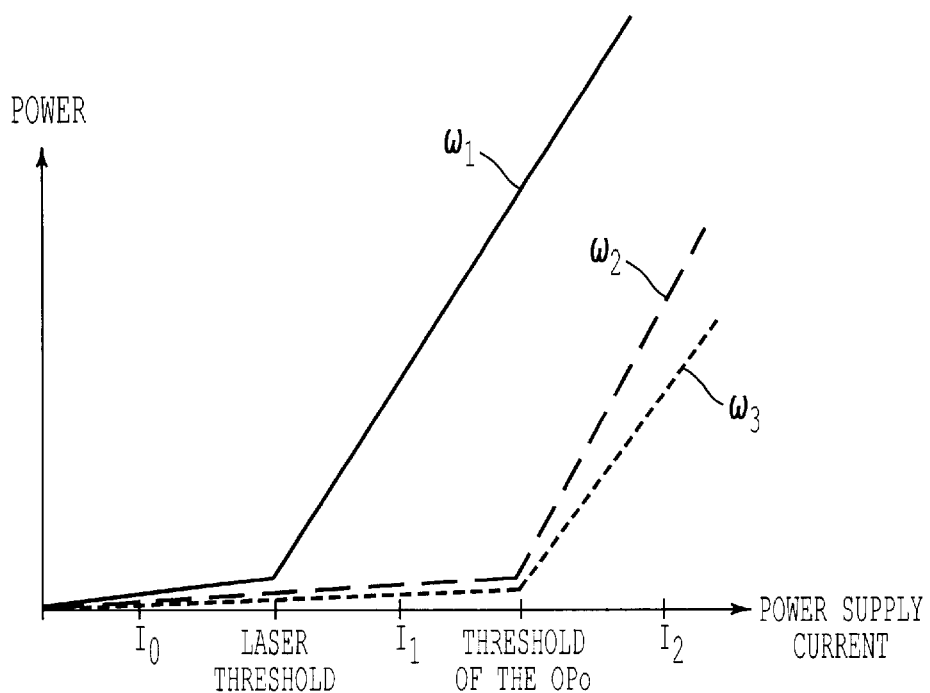
FIG. 3 shows curves of operation of the laser of the invention as a function of the value of the excitation current of the laser of the invention.

The spectral emission of the device as a function of the supply current is summarized in FIG. 2. The emission power values for the three frequencies $\omega_1$, $\omega_2$ and $\omega_3$ are given schematically as a function of the supply current in FIG. 3. The device has two thresholds: a laser threshold proper (for the wave at the frequency $\omega_1$) and a threshold OPO (for the signal and idler waves).

The object of the invention therefore consists in placing the pump laser source, the non-linear medium and the cavity inside a single semiconductor device. The advantages are therefore comparable to those of the semiconductor laser with respect to other lasers namely extreme compactness, simplicity of the device and low production cost.

A more detailed description shall now be given of the invention.

Figure 4:
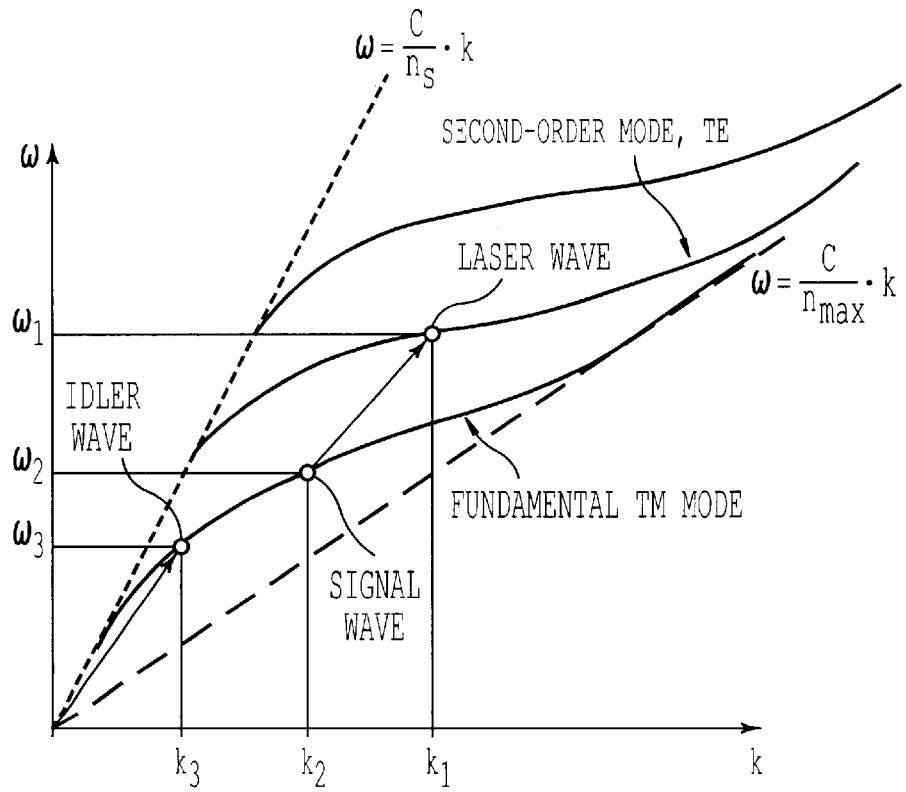
FIG. 4 shows another system of curves of operation of the laser of the invention.

Modal Phase Matching Condition (1):

The phase matching condition (1) is obtained between a second-order mode for the laser wave and two fundamental modes for the parametrical fluorescence. This is summarized schematically in FIG. 4 which shows the relationship of dispersion of the waveguide of the device. This dispersion graph locates the points at the frequencies $\omega_1$ (in the second-order TE mode), and the frequencies $\omega_2$ and $\omega_3$ (in the fundamental TM or TE modes). The phase-matching condition (1) is expressed graphically in a simple way in this figure. The phase-matching condition is achieved if the vector that meets the starting point and the point of lowest frequency is exactly equal to the vector meeting the other two frequencies (see FIG. 4).

To get the laser transition to occur on the second-order mode of the waveguide is not at all a natural thing. To obtain this, which is indispensable for the phase-matching condition, there are two solutions. The second-order mode must be favored over the fundamental mode. It is therefore possible to increase the gain for the second-order mode or else add losses for the fundamental mode.

First Solution: Increasing the Gain for the Second-order Mode

The emitter quantum wells are placed at the two bulges of the second-order mode. This increases the overlapping integral between the emitters and the second-order mode of the guide and hence the gain for the second-order mode with respect to the fundamental mode.

Second Solution: Increasing the Losses for the Fundamental Mode

Losses are introduced into the bulge of the fundamental mode, for example by means of high doping at the bulge of this mode. This approach however is less favorable than the first one because it is never advantageous to add losses into a laser.

Optimizing of the Integral of Overlapping (2):

The various means of optimizing the internal (2) are now described in detail:

First Approach: Making of an Asymmetrical Waveguide

Figure 5:
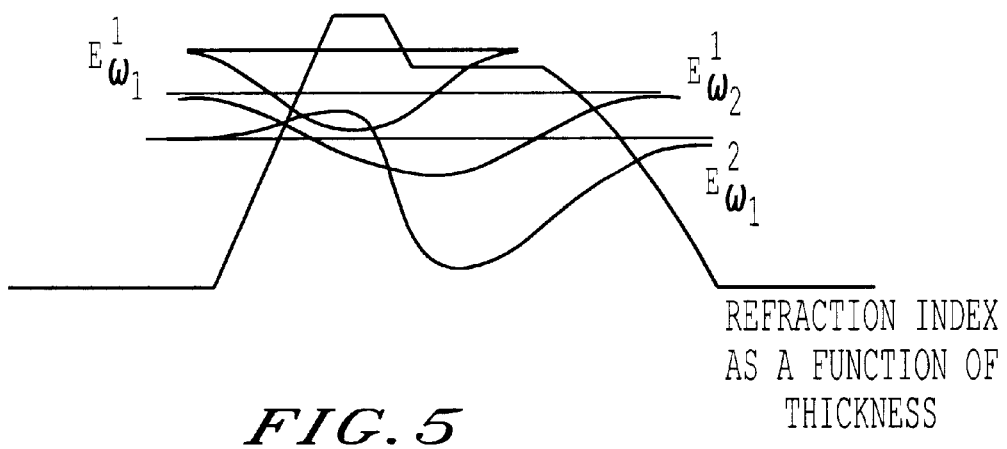
FIG. 5 shows an exemplary embodiment of the laser according to the invention.

A first approach consists in keeping a constant non-linear coefficient in the structure but in designing the structure of the waveguide so as to have a high integral on the non-zero fields. For this purpose, it is necessary to design an asymmetrical waveguide. The asymmetry of the index structure must be optimized so as to increase the integral (2). An exemplary optimized structure of this kind is shown in FIG. 5. For the design of such a structure, the goal is a waveguide in which the fundamental mode at $\omega_1$ is localized spatially at a different place from the fundamental mode at $\omega_2$ and $\omega_3$.

Thus, the integral (2), which is low if only fields at the same frequency $\omega$, are placed in it (because of the relationship of orthogonality between the modes given in (3)), will be non-zero when it is computed with the mixture of frequencies since the fundamental modes at ($\omega_1$ and $\omega_2$ are spatially very different.

Figure 6:
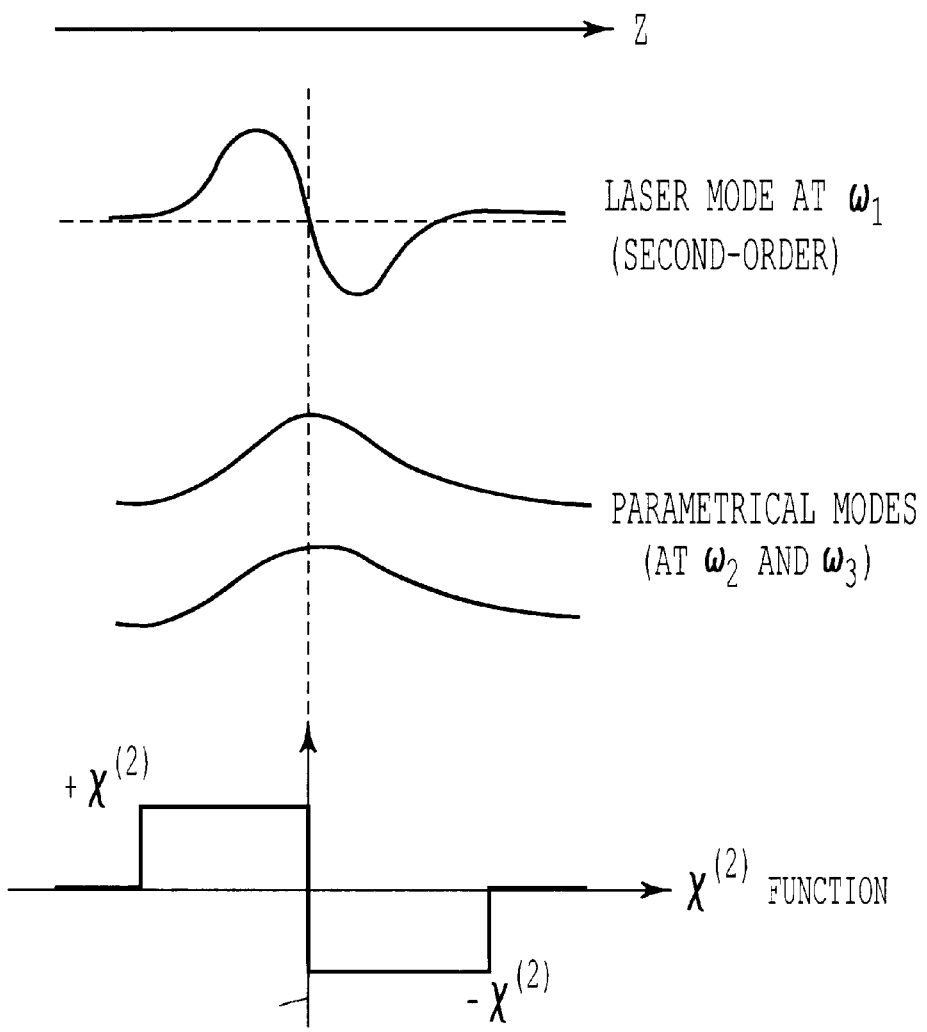
FIG. 6 shows different graphs explaining the working of the laser of the invention.

Second Solution: Variation of the Non-linear Coefficient in the Thickness of the Waveguide Another solution to optimize the integral (2) consists in having a $\chi^{(2)}$ function which is not constant in the waveguide which, for example, changes its sign. The integral is then important as is explained in FIG. 6. The different methods used to obtain a change in the sign of $\chi^{(2)}$ are the following:

1) One method uses asymmetrical quantum wells oriented in one direction and then the other during growth. It is known that high non-linear coefficients are given by the quantum wells. By changing the orientation of the quantum wells, the sign of the $\chi^{(2)}$ is changed, giving the desired result. These asymmetrical quantum wells are also the transmitter quantum wells for the laser. In this case, the non-linear coefficients of the massive material exists but is not used (or rather gives a very small contribution to the integral (2)).

2) The $\chi^{(2)}$ of the massive material GaAs itself is used. The quantum wells needed to obtain the laser are then symmetrical and do not contribute to the non-linear coefficient $\chi^{(2)}$. The reversal of the sign of the non-linear coefficient is obtained by a technique of overturned substrate bonding known to those skilled in the art. These substrate bonding techniques with different orientations ($\chi^{(2)}$, $-\chi^{(2)}$) have indeed been used to make materials with quasi-phase matching. Here, it is the other two halves of the laser structure that are bonded face to face with two opposite crystal orientations.

Figure 7A:
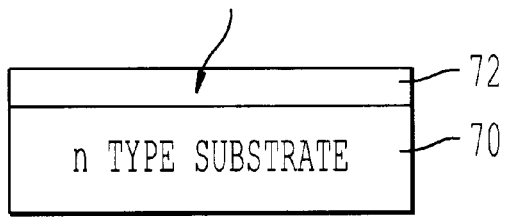
FIGS. 7a to 7c show an alternative embodiment of the laser according to the invention.
Figure 7B:
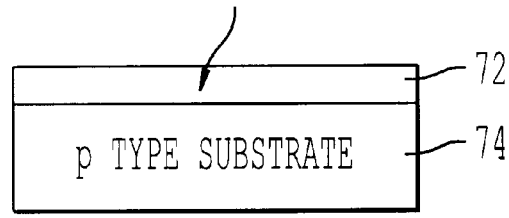
Figure 7C:
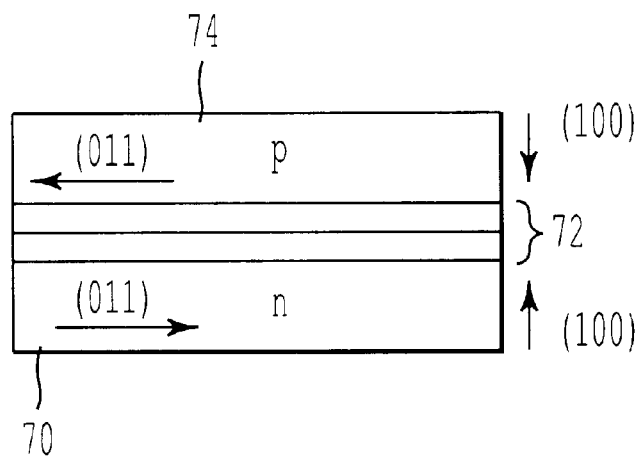

The bonding of the substrates (e.g. a n type substrate 70 to a p type substrate 74) is a delicate step because, ultimately, a laser wave guide structure (e.g. formed from the laser layers 72 shown in FIG. 7) has to be obtained with a thickness constant to the nearest nanometer after the bonding firstly and it is also necessary to have high electrical nanometer after the bonding firstly and it is also necessary to have high electrical characteristics to maintain high efficiency of the laser on the other hand. This technique is summarized in FIG. 7.

FIG. 1 shows a preferred embodiment of the invention which can be fabricated using the bonding process described above and shown in FIG. 7. An exemplary embodiment of such a structure is given here below. The structure may be as follows:

an n doped GaAs substrate 70, and a laser layer 72 including,

| | |
|---|---|
| n doped AlAs | 700 nm thickness |
| GaAs | 250 nm thickness |
| AlGaAs 70% | 250 nm thickness |

(This AlGaAs layer contains four quantum wells made of InGaAs emitting at 920 nm. The characteristics of these wells are known to those skilled in the art.)

doped AlAs 700 nm thickness.

Figure 8:
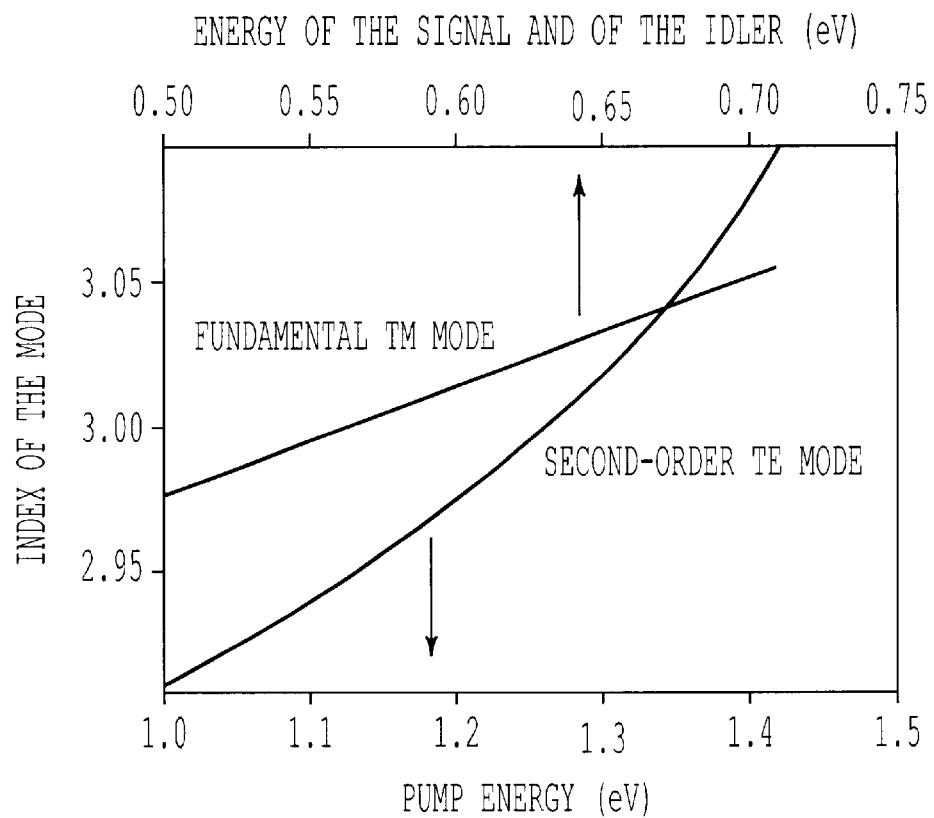
FIGS. 8 and 9 show graphs to determine the point of operation of the laser.

FIG. 8 shows the modal index as a function of the energy of the photons in the waveguide of the device. These simulations have been made with values of indices of materials forming the known device in the literature.

It can be seen that, for energy of 1.34 eV, the index of the second order TE mode is equal to the index of the energy photons that is halved (0.67 eV) for the fundamental TM mode. There is therefore phase matching for the process:

1 photon (1.34 eV)→2 photons (0.67 eV).

Figure 9:
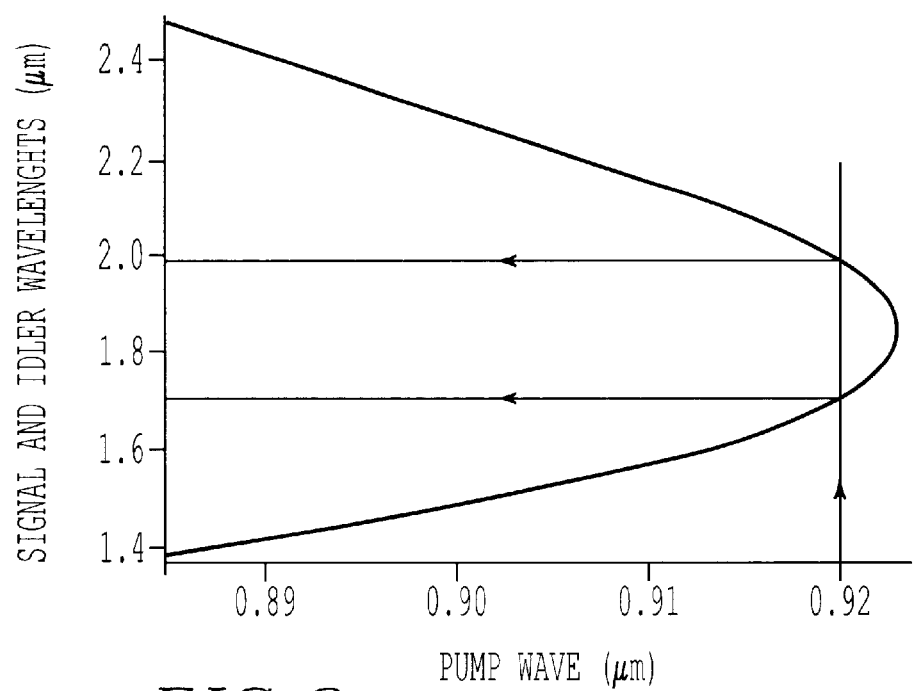

This is the particular case of parametrical fluorescence where the two signal and idler waves are identical, known as degenerescence. Around this degenerescence, many other phase matching processes are possible. They are summarized in FIG. 9 which shows; possible signal and idler wavelengths generated from the pump wave on the X-axis. If the quantum well emits at a wavelength of 920 nm, it can be seen that the semiconductor layer (pump wave (at 920 nm)) will generate two waves at 1.7 and 2 $\mu$m respectively.

FIG. 8 shows the second-order TE mode and the first-order TM fundamental mode. This figure shows that by placing the InGaAs quantum wells carefully in the AlGaAs 70% part, the wells have a high overlap with the second-order mode. The result of this will be that the semiconductor laser will lase on the second-order. This is of prime importance to the working of the device according to the invention.

What is claimed is:

1. A semiconductor laser comprising:
    a waveguide including,
        a light-emitting quantum well and at least two layers of an optically non-linear material, said non-linear material converting light emitted from said light-emitting quantum well in the waveguide into parametric conversion waves for emission from said waveguide, and
        said quantum well located within one of the layers of the optically non-linear material and on a mode of the waveguide higher than a fundamental mode of the waveguide, and configured to emit a pump wave as a light for parametric conversion,
        wherein thickness and optical indices of the at least two layers are such that the wave guide has a modal phase matching condition for parametrical fluorescence between the pump wave emitted by the quantum well and said parametrical conversion waves in the waveguide.

2. A laser according to claim 1, wherein the quantum well is located on a second-order mode of the waveguide.

3. A laser according to claim 2, wherein the quantum well is not located in one of said at least two layers having a higher optical index.

4. A laser according to claim 2, wherein the at least two layers comprise at least three layers of said optically non-linear material.

5. A laser according to claim 2, wherein the pump wave has a pump mode located on a second-order mode of the waveguide.

6. A laser according to claim 5, wherein the at least two layers comprise at least three layers of said optically non-linear material.

7. A laser according to claim 1, wherein the modal phase matching condition matches the pump wave of a given order with the parametric waves of a different order than the pump wave.

* * * * *